United States Patent [19]

Grassl

[11] Patent Number: 4,701,657
[45] Date of Patent: Oct. 20, 1987

[54] DISPERSIVE INTERDIGITAL TRANSDUCER FOR ARRANGEMENTS OPERATING WITH ACOUSTIC WAVES

[75] Inventor: Hans-Peter Grassl, Zorneding, Fed. Rep. of Germany

[73] Assignee: Siemens Aktiengesellschaft, Berlin and Munich, Fed. Rep. of Germany

[21] Appl. No.: 894,664

[22] Filed: Aug. 8, 1986

[30] Foreign Application Priority Data

Aug. 21, 1985 [DE] Fed. Rep. of Germany ....... 3529916

[51] Int. Cl.$^4$ ............................................. H01L 41/08
[52] U.S. Cl. .............................. 310/313 C; 310/313 B; 333/154; 333/196
[58] Field of Search ........... 310/313 R, 313 B, 313 C; 333/150–155, 193–196

[56] References Cited

U.S. PATENT DOCUMENTS

| | | |
|---|---|---|
| 3,845,419 | 10/1974 | Nudd ................................ 310/313 B |
| 4,258,342 | 3/1981 | Miyajima et al. ................ 333/196 X |
| 4,427,954 | 1/1984 | Veith ................................ 333/154 X |
| 4,507,581 | 3/1985 | Tabuchi et al. .................. 310/313 B |

FOREIGN PATENT DOCUMENTS 2120891 12/1983 United Kingdom .

OTHER PUBLICATIONS

Proceedings of IEEE Ultrasonic Symposium, 1974, pp. 224 through 227.
Proceedings IEEE Ultasonic Symposium, 1981, pp. 181–185, 186–191.

*Primary Examiner*—Mark O. Budd
*Attorney, Agent, or Firm*—Hill, Van Santen, Steadman & Simpson

[57] ABSTRACT

A dispersive transducer 100 which has non-equidistant distribution of the finger electrodes 6, 7, 16 and 17 according to band-width such that the finger electrodes 16 and 17 of the low frequency portion 11 of the transducer have a width c and spacing d1 (or d2) which are equal to the corresponding portions of the highest frequency part 13 of the transducer such that reflections are substantially reduced or eliminated.

6 Claims, 5 Drawing Figures

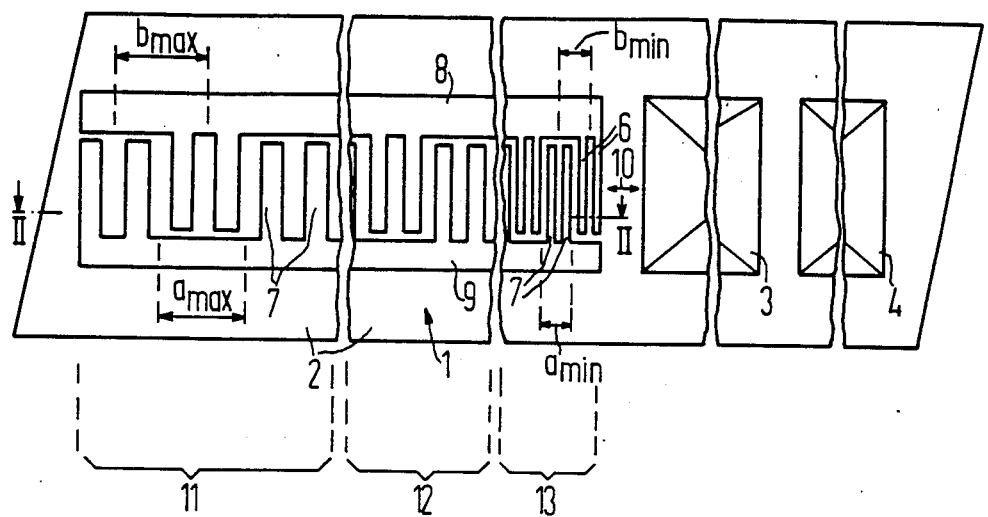
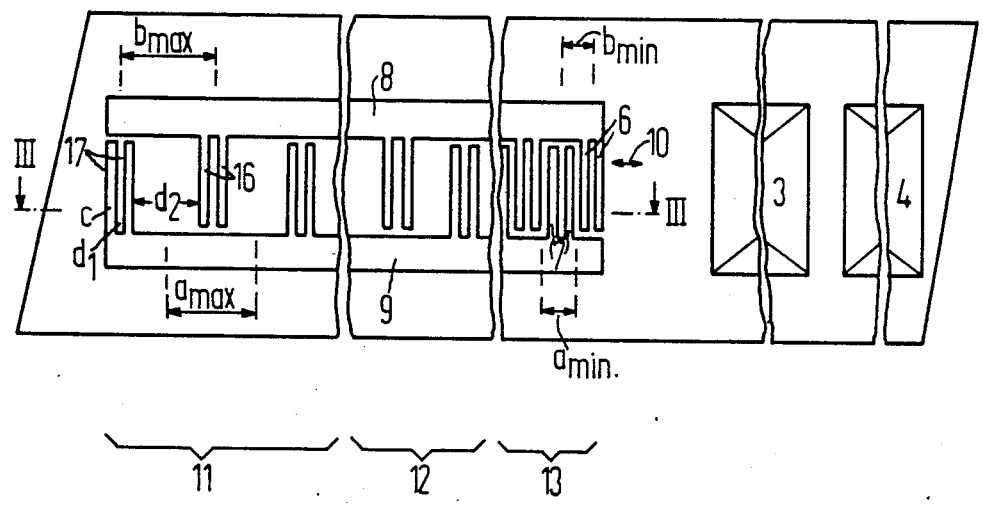

DISPERSIVE INTERDIGITAL TRANSDUCER FOR ARRANGEMENTS OPERATING WITH ACOUSTIC WAVES

BACKGROUND OF THE INVENTION

1. Field of the Invention

This invention relates in general to dispersive interdigital transducers for acoustic waves which have split finger arrangements.

2. Description of the Prior Art

Prior art structures such as shown, for example, in transducers using acoustic waves such as described in the article Pro. IEEE, Ultrasonics Symposium (1974), pages 224 through 227 and the same magazine of 1981 on pages 181 through 185 discloses for example electric filter resonator arrangements that operate with acoustic waves which travel in a substrate in at least one surface-proximate region of the substrate. Such acoustic waves are known as Rayleigh waves, Bleustein waves, Love waves, SSBW waves, SABB waves and these are referred to below generally as surface waves although strictly speaking only the two former wave types are surface waves.

Such arrangements with acoustic waves comprise piezoelectric properties at least in the region of the interdigital transducers employed as input transducers and/or as output transducers. An interdigital transducers which is employed uses finger electrodes which are arranged parallel to each other on the surface of the substrate and these are usually distributed as two comb-shaped structures which are formed by the fingers and respective bus bars. The comb structures interdigitally engage each other and the finger electrodes are usually strip-shaped metallization codings on the substrate surface.

For the acoustic wave running in the surface region of the substrate, such finger electrodes also act as reflectors which is undesirable in interdigital transducers. There have been many proposals as to how such undesired reflections occurring at the finger electrodes of an interdigital transducer can be reduced or eliminated. A first such measure in known split finger devices of interdigital transducers is to divide each individual finger into two fingers which are parallel next to one another and which are electrically connected to the same polarity and which are both connected to the same bus bar. In the simple interdigital transducer the center to center spacing from one finger electrode to the neighboring oppositely polarized following finger electrode usually is $\lambda/2$ where $\lambda$ is the wavelength of the acoustic wave. This center to center spacing is also the same as the center to center spacing from one piezoelectric excitation center between two oppositely polarized finger electrodes to the neighboring excitation center. This definition also applies to an interdigital transducer used as a reception transducer. Accordingly, with the center to center spacing of $\lambda/2$ it is standard to make a finger electrode with dimensions of $\lambda/4$ and the clearance between two neighboring finger electrodes as $\lambda/4$.

SUMMARY OF THE INVENTION

The split finger interdigital transducer according to the invention using a spacing of $\lambda/2$ between neighboring excitation centers has a width of $\lambda/8$ for the individual split finger electrodes and the $\lambda/8$ for the clearance between two individual split finger electrodes.

A split finger embodiment of an interdigital transducer is essentially free of interdigital reflections. Strictly speaking, however, this only applies for the acoustic wave which has a value of the wavelength $\lambda$ for which the dimensioning of the finger electrode spacing width and clearance is based. In many applications such as with resonators and narrow band filters no problem results from using these dimensions. However, when working with acoustic waves which have a higher band width particularly a band width which comes close to the value of an octave or is greater than one or more octaves problems occur. Dispersive interdigital transducer having finger spacings with clearance which is measured in units of $\lambda$ are to be employed for such arrangements such that the transducers which extend over a certain length on the substrate in different length portions are based on the wavelength values of the prescribed band width regions of different size. In the control case, such a dispersive interdigital transducer relative to one direction of its longitudinal dimension has uniformly decreasing finger spacings, widths and clearances which increase in the opposite direction, in other words one end of the transducer is based on the greatest wavelength value of $\lambda_{max}$ of the lowest frequency of the bandwidth region and the other end is based on the smallest wavelength value $\lambda_{min}$ of the highest frequency at this bandwidth.

Great disturbances due to interdigital reflections can occur in the dispersive transducer when $\lambda_{max}$ is equal to for example to 1.5 $\lambda_{min}$ for the prescribed bandwidth. A first maximum of interdigital reflections occurs for $\lambda_{max}$ which is equal to twice $\lambda_{min}$.

It is an object of the invention to provide embodiments for split finger arrangement of an interdigital transducer which is dimensional such that a dispersive transducer for a broader bandwidth range can be provided which transducer of the invention is not subject to substantial noise signal.

This object of the invention is accomplished with the dispersive interdigital transducer wherein the spacing and dimension of the neighboring excitation centers and the width of the finger electrodes and the clearance of the neighboring fingers are selected in a novel manner.

In the previously referenced publication Pro. IEEE Ultrasonics Symposium on page 187 of the 1980 publication, a dispersive arrangement having fingers of respective identical widths is shown. This, however, does not comprise a split finger arrangement and the identical width of the simple fingers does not even accidentally have the same effect as the structure of the invention and does not suppress disturbing reflections in the manner of the invention.

The present invention is based on the realization that noise signals which are based on the above-described interdigital reflections occur in a broadband dispersive interdigital transducer even though a split finger arrangement is selected for the interdigital transducer. The invention is based on the realization that the reflections cannot be fundamentally eliminated and can only be diminished so as to reduce their effects. In the invention, it has therefore been taken into consideration that it is precisely broadband dispersive interdigital transducers which have a relatively great number of successive finger electrodes parallel to the axis of the main wave propagation of the transducer and in other words, of reflecting points for interdigital reflections is high. In the present invention, it is provided that the dimensions of the width of the finger electrodes which correspond to the corresponding dimensions of the finger electrodes of that portion of the transducer intended for the highest frequency part of the bandwidth region are provided in those parts of the associated transducer which are tuned to the lower frequency region of the prescribed bandwidth.

A further feature of the invention is to properly define and properly divide or distribute the dimensions of the modified spacings or respectively clearances between the finger electrodes which thus results in the low frequency part of the transducer.

It should be noted that the invention can also be utilized with thin finger interdigital transducers even though thinning of the fingers is of less significance for dispersive transducers particularly for narrow band transducers having greater lengths.

A feature of the invention is to employ interdigital transducers which are constructed according to the invention for surface wave convolver arrangements and in particular for convolver arrangements which have compensated self-convolution. The high bandwidth has particular significance for convolver arrangements, however, broad band interdigital transducers are also required in numerous other applications of structures which operate with acoustic waves.

Other objects, features and advantages of the invention will become apparent from the following description when read in view of the drawings in which:

BRIEF DESCRIPTION OF THE DRAWINGS

FIG. 1 comprises a plan view of a dispersive interdigital transducer having split finger arrangements according to the prior art;

FIG. 5 is a plan view of the invention illustrated in FIG. 3.

DESCRIPTION OF THE PREFERRED EMBODIMENTS

Figure 2:
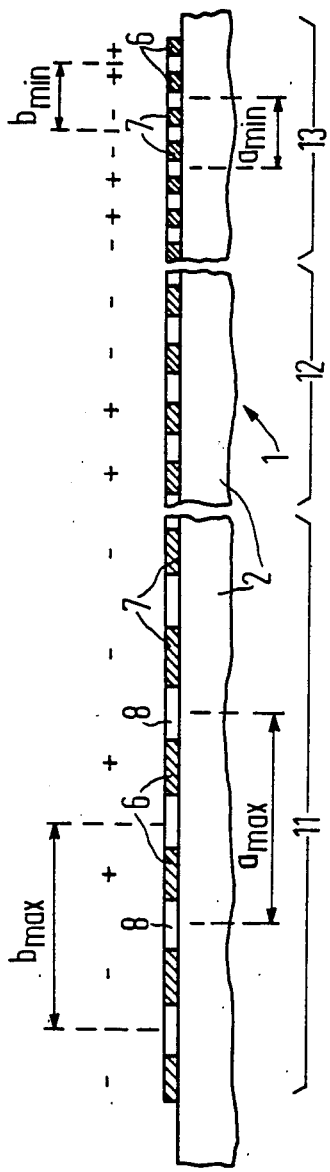
FIG. 2 is a schematic illustration in sections of the known dispersive interdigital transducer illustrated in FIG. 1.

FIG. 1 illustrates a dispersive interdigital transducer mounted on the surface of a substrate 2. An integration electrode 3 is mounted on the substrate surface and may also be a beam compressor arrangement and an output interdigital transducer or convolver arrangement 4 is also mounted on the substrate 2.

Individual finger electrodes 6 and 7 of the transducer 1 are illustrated and bus bars 8 and 9 for the fingers 6 and 7 are connected thereto. With the split finger arrangement, two neighboring electrodes 6 are connected to one bus bar 8 and two neighboring finger electrodes 7 are connected to the other oppositely polarized bus bar 9. As is illustrated in FIG. 1, electrode finger width and clearances decreases from left to right parallel to the main wave propagation direction 10 of the transducer 1 relative to FIG. 1. The spacing $a_{max}$ correspondingly decreases to $a_{min}$ where a is equal to $\lambda/2$ is the spacing between the dashed lines of the excitation centers which exist in the transmission transducer. These excitation centers lie between oppositely polarized fingers 6 and 7. The corresponding center to center spacing of neighboring oppositely polarized split finger pairs is referenced as b. The length of the portion of transducer 1 illustrated by the numeral 11 in FIG. 1 is tuned to the region of the low frequencies which has the greatest wavelength of $\lambda/_{max}$ of the prescribed bandwidth. The length portion 12 corresponds to the center frequency region and the length part 13 corresponds to the high frequency portion which has width $\lambda/_{min}$ of the transducer 1. This is illustrated in FIG. 1 where the transducer 1 is a fundamental type particularly with respect to parts 11 through 13 and the number of finger electrodes of the overall transducer.

FIG. 2 is a sectional view illustrating the finger electrodes 6 and 7 and the substrate 2. The bus bar is not shown in section and is shown in the background. The instantaneous polarity plus is assumed for bus bar 8 and the finger electrodes 6 which are connected to it. The portions for the low 11, the center 12 and the high frequency 13 of the finger electrodes 6 and 7 of the transducer correspond to that shown in FIG. 1. The respective widths of the individual finger electrodes 6 and 7 is referenced by c and the clearance between two neighboring finger 6 and the neighboring fingers 6 and 7 is indicated by d. It may be observed that the dimensions a, b, c and d are not constant over the length of the transducer 1. This corresponds to the dispersion of the transducer 1.

Figure 3:
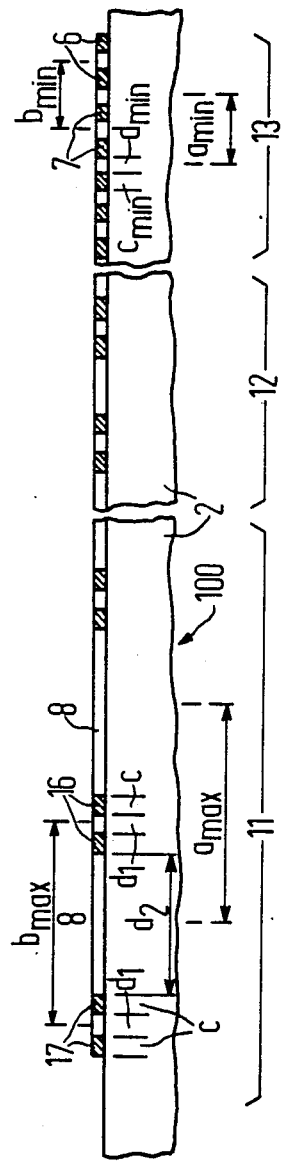
FIG. 3 is a schematic illustration of a dispersive interdigital transducer according to the invention.

FIG. 3 illustrates the inventive embodiment of an interdigital transducer 100. The high frequency portion 13 of the transducer 100 of FIG. 3 corresponds with the high frequency portion 13 of the known transducers illustrated in FIGS. 1 and 2. This portion of the transducer 100 which is tuned to the highest frequencies and has the wavelength $\lambda/_{min}$ of the prescribed bandwidth region. The spacing $\lambda/_{min}/2$ between two neighboring excitations centers is $a_{min}$. The spacing $a_{min}$ is used in the center to center spacing between two neighboring split finger pairs which have opposite polarity and $c_{min}$ is the width of the finger electrodes and $d_{min}$ is the clearance between two neighboring finger electrodes having the same polarity or opposite polarity. Such dimensions also apply to the second modification of the invention as far as portion 13 is concerned and this is illustrated in FIG. 4.

The difference between the invention occurs in portions 11 and 12 for the low and midfrequency portions as compared to the prior art illustrated in FIGS. 1 and 2. In the invention, the width of the fingers is referenced by dimension c and the clearance between two finger electrodes of a split finger pair, in other words, between two finger electrodes of identical polarities referenced as $d_1$. The clearance between two neighboring finger electrodes 16 and 17 having different polarities is referenced as $d_2$ and deviates considerably from dimension $d_1$. In the invention, it is essential that the width c of the finger electrodes 16 and 17 be equal to the value of $c_{min}$ are not significantly greater and at a maximum no more than $1.5 \times$ greater than $c_{min}$. The width $d_1$ of the clearance between two electrodes fingers 16 and 17 of a split finger pair according to the invention illustrated in FIG. 3 is equal to $d_{min}$ or at least not significantly greater than $d_{min}$ for instance not more than 1.5 times greater. It should also be noted that c and $d_1$ can also be dimensioned smaller than $c_{min}$ or, respectively, $d_{min}$ but this causes increased complicity of the technological structure. The preferred dimensions are $c_{min}=d_{min}=c=d_1$.

In the transducer 100 of the invention, the dimensions of the width c with the finger electrodes 16 and 17 and the spacing $d_1$ between isopolarized electrode finger 16 and 17 are also selected for that high frequency portion 13 as well as for the low frequency portion 11, as well as the mid-frequency portion 12 which is arranged between them. The dimension $d_2$ is significantly larger than that used in prior art devices because the following condition exists: $b_{max}=d_2+2 \cdot c + d_2$ wherein $b_{max}=\lambda_{max}/2$.

Figure 4:
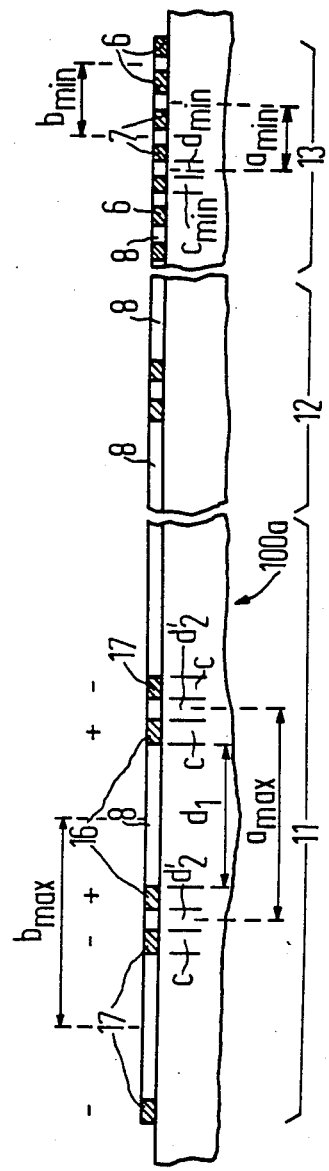
FIG. 4 illustrates a second modification of the invention.

FIG. 4 illustrates a transdcuer 100a of the invention which is a modified form of the invention illustrated in FIG. 3. The transducers 100 illustrated in FIG. 3 and 100a illustrated in FIG. 4 differ from each other in that the finger electrodes 16 and 17 in the transducer 100a are distributed differently than those in transducer 100. The two alternative structures of the invention or however based on the same principle which is that the dimensioning of the width of the finger electrodes in FIG. 4 is the same as in FIG. 3. In the transducer 100a however, the width $b_2'$ is selected in a manner analogous to the dimensions $d_1$ of the transducer 100 and in other words respectively one electrode finger 16 of the one polarity in the transducer 100a is positioned closely adjacent to an electrode finger 17 of the other polarity. The dimension $d_1'$ of the clearance between the finger electrode 16 and the finger electrode 17 and of the respective pair of split fingers are comparable. The following equation is valid: $b_{max}=a_{max}=b_1'+2$. $c+d_2'=\lambda_{max}/2$. The comments regarding the midfrequency portion 12 of the transducer 100 also applies to the midfrequency portion 12 of the transducer 100a illustrated in FIG. 4.

The transducer of the invention can also be partly executed over its length according to alternatives of the transducer 100 and partly according to the alternative of the transducer 100a. For example, the low frequency portion 11 can be executed according to that illustrated in FIG. 3 and the midportion 12 can be executed as shown in FIG. 4 whereby the high frequency portion 13 is always at least essentially constructed as shown in FIGS. 2, 3 and 4.

FIG. 5 is a plan view of the invention and illustrates the transducer 100. The various dimensions for the fingers 16 and 17 are their spacing is clearly illustrated.

Although the invention has been described with respect to preferred embodiments, it is not to be so limited as changes and modifications can be made which are within the full intended scope of the invention as defined by the appended claims.

I claim as my invention:

1. A dispersive interdigital transducer for arrangements with acoustic waves, having a split finger arrangement, and where a distribution of the finger electrodes and the dimensioning of the excitation centers is established by the finger distribution such that the dispersive interdigital transducer has a band-width which extends up to one or more octaves, whereby, in that part (13) of said interdigital transducer which is provided for the high frequencies ($\lambda_{min}$), the spacings a and b between neighboring excitations centers (a and b=$\lambda_{min}/2$) and the width c of the finger electrodes (c=$\lambda_{min}/8$) and the spacing clearance d of all neighboring fingers (d=$\lambda_{min}/8$) where $\lambda_{min}$ is the wavelength of the highest frequencies and the corresponding dimensions in the remaining parts (11, 12) of the interdigital transducer which are respectively selectively tuned to the lower and midfrequencies of the band-width, characterized in that the spacing ($d_1$) of neighboring excitation centers of split fingers (16 and 17) from each other which are polarized the same is equal to the spacing d of the transducer which is provided for high frequencies and the spacings ($d_2$) between neighboring finger centers of the split finger pairs (16 and 17) which are polarized opposite to each other is substantially larger than $d_1$, the width c of the individual finger electrodes (16, 17) and the clearance ($d_1$) between the individual split finger electrodes (16 or, respectively, 17) of the individual split finger electrode pairs are approximately equal to the finger width c and clearance d dimensions of the part (13) of the interdigital transducer (100) provided for the high frequencies of the band-width.

2. A dispersive interdigital transducer for arrangements with acoustic waves, having a split finger arrangement, and where a distribution of the finger electrodes and dimensioning of the excitation centers established by the finger distribution of said dispersive interdigital transducer has a band-width which extends up to one or more octaves, whereby, that part (13) of this interdigital transducer dimensioned for the high frequency ($\lambda_{min}$), the spacing a between neighboring excitation centers (a=$\lambda_{min}/2$) and the width c of the finger electrodes (c=$\lambda_{min}/8$) and the clearance d between neighboring fingers (d=$\lambda_{min}/8$) where $\lambda_{min}$ is the wavelength of the highest frequencies, and the corresponding dimensions in the remaining parts (11, 12) of the interdigital transducers which are selectively tuned to the lower and midfrequency of the band-width, characterized in that the spacing $d_1$ of neighboring excitation centers which are polarized the same of said lower and midfrequency portions equals the spacing d of the transducer for the high frequencies and the spacing ($d_2$) between neighboring fingers of the split finger pairs (16 and 17) which are polarized opposite to one another is substantially larger than $d_1$, the width c of the individual finger electrodes (16, 17) and the clearance ($d_1$) between neighboring split finger electrodes (16, 17) of opposite polarity are approximately the same as the finger width c and clearance d dimensions of the part 13 of the interdigital transducer (100a) provided for the high frequencies of the band-width.

3. A transducer according to claim 1, characterized in that the width c of the finger electrodes 16 or, respectively, 17 and the clearance ($d_1$) between neighboring finger electrodes 16 or 17 of a respective split finger pair is not greater than 1.5 times the width (c) and clearance (d) of the finger electrodes of the part 13 of the transducer (100) provided for the high frequencies.

4. A transducer according to claim 2, characterized in that the width c of the finger electrodes (16, 17) and the clearance $d_2'$ are not greater than 1.5 times the width (c) and clearance (d) of the part 13 of the transducer 100a provided for the high frequencies.

5. A dispersive interdigital transducer for arrangements with acoustic waves, having a splitfinger arrangement, with such a distribution of the finger electrodes and such dimensioning of the excitation centers established by said finger distribution of said dispersive interdigital transducer such, that the band-width extends up to one or more octaves, whereby, in that the part (13) of said interdigital transducer which is dimensioned for the high frequencies ($\lambda_{min}$) of the band-width where $\lambda_{min}$ is the wave length at the high frequencies, the spacing "a" between neighboring excitations centers is equal to $\lambda_{min}/2$ and the width c of the finger electrodes is equal to $_{min}/8$ and the clearance d between all neighboring fingers (d=$\lambda_{min}/8$) are dimensioned to be equal to those for the highest frequencies of the band-width, and the corresponding dimensions in the remaining parts (11, 12) of the interdigital transducer which are selectively tuned to the lower and midfrequencies of the bandwidth, characterized in that the spacings ($d_1$) of the neighboring excitation centers from one another in the lower and midfrequency portions are equal to the spacings ($d_{min}$) of the fingers in the high frequency portion and the spacings ($b_{max}$) between neighboring finger centers of the split finger pairs (16, 17) which are polarized opposite to one another for the lower and midfrequency portion are larger than the spacings between fingers of the higher frequency portion, the width c of the individual finger electrodes (16, 17) and the clearnce $d_1$ between the individual split finger electrodes (16 or, respectively, 17) of the individual split finger electrode pairs of the lower and midfrequency portion are approximately equal to the finger width and clearance dimensions (c, d) for the part (13) of the interdigital transducer (100) which is provided for the high frequencies of the band-width.

6. A dispersive interdigital transducer for arrangements with acoustic waves, having a split finger arrangement, with such a distribution of the finger electrodes and such dimensioning of the excitation centers established by said finger distribution of said dispersive interdigital transducer such that the band-width extends up to one or more octaves, whereby, in that the part (13) of said interdigital transducer dimensioned for the high frequencies ($\lambda_{min}$) of the band-width where $\lambda_{min}$ is the wavelength of the high frequencies, the spacing "a" between neighboring excitations centers is equal to $\lambda_{min}/2$ and the width (c) of the finger electrodes is equal to $\lambda_{min}/8$ and the clearance (d) between all neighboring fingers is equal to $\lambda_{min}/8$ are dimensioned to be equal to those for the highest frequencies of the band-width, and the corresponding dimensions in the remaining parts (11, 12) of the interdigital transducer which are selectively tuned to the lower and midfrequencies of the band-width, characterized in that the spacings ($d_1$) of neighboring excitation centers of the same polarity from one another in the lower and midfrequency portions are equal to the spacings ($d_{min}$) of the finger is the high frequency portion (13) and the spacings ($b_{max}$) between neighboring finger centers of the split finger pairs (16, 17) which are polarized opposite to one another for the lower and midfrequencies are larger than the spacings between finger centers of the higher frequency portion, the width c of the individual finger electrodes (16, 17) and the clearance $d_2$ between neighboring split finger electrodes (16, 17) of opposite polarity of the low and midfrequency portions are approximately the same as the finger widths "c" and clearance d of the part (13) of the interdigital transducer (100a) provided for the high frequencies of the bandwidth.

* * * * *